(12) United States Patent
Chen

(10) Patent No.: US 9,559,229 B2
(45) Date of Patent: Jan. 31, 2017

(54) MULTI-JUNCTION SOLAR CELL

(75) Inventor: Tzer-Perng Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 724 days.

(21) Appl. No.: 12/981,780

(22) Filed: Dec. 30, 2010

(65) Prior Publication Data

US 2011/0155231 A1    Jun. 30, 2011

(30) Foreign Application Priority Data

Dec. 31, 2009  (TW) ................. 98146648 A

(51) Int. Cl.
| | |
|---|---|
| *H01L 31/00* | (2006.01) |
| *H01L 31/0352* | (2006.01) |
| *B82Y 20/00* | (2011.01) |
| *B82Y 30/00* | (2011.01) |
| *H01L 31/0687* | (2012.01) |
| *H01L 31/078* | (2012.01) |
| *H01L 31/18* | (2006.01) |
| *H01L 31/056* | (2014.01) |

(52) U.S. Cl.
CPC .......... *H01L 31/0352* (2013.01); *B82Y 20/00* (2013.01); *B82Y 30/00* (2013.01); *H01L 31/035218* (2013.01); *H01L 31/035236* (2013.01); *H01L 31/035281* (2013.01); *H01L 31/056* (2014.12); *H01L 31/0687* (2013.01); *H01L 31/078* (2013.01); *H01L 31/1892* (2013.01); *Y02E 10/50* (2013.01); *Y02E 10/52* (2013.01); *Y02E 10/544* (2013.01)

(58) Field of Classification Search
CPC .............. H01L 31/0352; H01L 31/035236; H01L 31/035281; H01L 31/0527; H01L 31/0687; Y02E 10/544; Y02E 10/50

USPC ................ 136/244, 252, 255, 256
See application file for complete search history.

(56) References Cited

U.S. PATENT DOCUMENTS

| | | | | |
|---|---|---|---|---|
| 4,295,002 | A | * | 10/1981 | Chappell et al. ............ 136/244 |
| 4,406,913 | A | * | 9/1983 | Weyrich .............. H01L 31/0236 |
| | | | | 136/255 |
| 4,514,583 | A | * | 4/1985 | Izu et al. ...................... 136/259 |
| 4,881,979 | A | | 11/1989 | Lewis |
| 5,250,120 | A | * | 10/1993 | Takada ............ H01L 31/022425 |
| | | | | 136/256 |
| 5,614,435 | A | | 3/1997 | Petroff et al. |
| 5,853,497 | A | * | 12/1998 | Lillington et al. ............ 136/249 |
| 2008/0156366 | A1 | * | 7/2008 | Kim ...................... B82Y 20/00 |
| | | | | 136/255 |

(Continued)

FOREIGN PATENT DOCUMENTS

| | | |
|---|---|---|
| CN | 101038866 A | 9/2007 |
| CN | 101345268 A | 1/2009 |

(Continued)

OTHER PUBLICATIONS

English machine translation of JP2002-151707A.*

*Primary Examiner* — Lindsey Bernier
(74) *Attorney, Agent, or Firm* — Patterson + Sheridan, LLP

(57) ABSTRACT

The disclosure provides a multi-junction solar cell structure and the manufacturing method thereof, comprising a first photovoltaic structure and a second photovoltaic structure; wherein at least one of the first photovoltaic structure and the second photovoltaic structure comprises a discontinuous photoelectric converting structure.

7 Claims, 9 Drawing Sheets

(56) References Cited

U.S. PATENT DOCUMENTS

| | | |
|---|---|---|
| 2008/0190479 A1 | 8/2008 | Hsieh et al. |
| 2008/0257409 A1* | 10/2008 | Li et al. .................. 136/259 |
| 2009/0038678 A1* | 2/2009 | Pan .................. H01L 31/1852 |
| | | 136/255 |
| 2009/0065047 A1* | 3/2009 | Fiorenza et al. .............. 136/255 |
| 2009/0272438 A1 | 11/2009 | Cornfeld |

FOREIGN PATENT DOCUMENTS

| | | | |
|---|---|---|---|
| CN | 101425548 A | | 5/2009 |
| JP | 2002151707 A | * | 5/2002 |

* cited by examiner

W2

4a 40
41

4b 40
41

MULTI-JUNCTION SOLAR CELL

CROSS REFERENCE TO RELATED APPLICATIONS

This application claims priority to Taiwan application No. 098146648, filed Dec. 31, 2009.

TECHNICAL FIELD

The application relates to a multi-junction solar cell structure and the manufacturing method thereof.

DESCRIPTION OF BACKGROUND ART

Because the petroleum source is limited, various kinds of substitutive energy are developed extensively and turned into products. Among those, the solar cell has become the commercial products for either the industrial or the residential use, and the III-V multi-junction solar cell is mainly applied to the space industry and the industrial field because of its high conversion efficiency. The structure of this kind of solar cell is a lattice-matched triple junction Ge/GaAs/GaInP structure. $Ga_{1-x}In_xP$ (1.85 eV; x~0.5), which is called the top cell, has the larger band gap and is the upmost layer to absorb the photon with higher energy (the wavelength from the range of the ultraviolet to the visible light); GaAs, which is called the middle cell, has the band gap with 1.42 eV and can absorb the photon with the wavelength in the near IR range; Ge, which is called the bottom cell, has the band gap with 0.74 eV and can absorb the light passed through the upper two layers with the wavelength in the IR range. Because the absorbed spectrum range is broader, the conversion efficiency is larger than 30%.

SUMMARY OF THE DISCLOSURE

A novel multi-junction solar cell in accordance with the present application is disclosed, which has the high efficiency and could improve the heat dissipating property.

The steps of a manufacture method of a multi-junction solar cell in accordance with one embodiment of the present application include providing a growth substrate; forming a buffer layer on the growth substrate; forming a contact layer on the buffer layer; forming a first photovoltaic structure on the contact layer; forming a first tunnel junction structure on the first photovoltaic structure; forming a second photovoltaic structure on the first tunnel junction structure; forming a photon recycling layer on the second photovoltaic structure; providing a supporting body; forming a connecting layer on the supporting body; connecting the photon recycling layer and the supporting body by the connecting layer; removing the growth substrate to expose the contact layer; removing part of the contact layer to expose partial surface of the first photovoltaic structure; forming a first electrode on the contact layer, a second electrode electrically connecting to the supporting body, and an anti-reflection layer on the exposed surface of the first photovoltaic structure; wherein at least one of the first photovoltaic structure and the second photovoltaic structure comprises a discontinuous photoelectric converting structure.

In accordance with one embodiment of the present application, the discontinuous photoelectric converting structure is located in a plurality of the cavities and the cavities are defined by a patterned structure layer.

A multi junction solar cell in accordance with another embodiment of the present application includes a supporting body; a connecting layer located on a surface of the supporting body; a first electrode located on another surface of the supporting body; a photon recycling layer located on the connecting layer; a first photovoltaic structure comprising a first band gap located on another part surface of the photon recycling layer; a first tunnel junction structure located on the first photovoltaic structure; a second photovoltaic structure comprising a second band gap located on the first tunnel junction structure; a contact layer located on a part of the surface of the second photovoltaic structure and forming the ohmic contact with the second photovoltaic structure; and a second electrode located on the contact layer; an anti-reflection layer located on at least another part of the surface of the second photovoltaic structure, wherein at least one of the first photovoltaic structure and the second photovoltaic structure comprises a discontinuous photoelectric converting structure.

BRIEF DESCRIPTION OF THE DRAWINGS

The drawings are used to promote the realization of the present application and are a part of the specification. The embodiments shown in the drawings cooperate with the explanation in the "detailed description of preferred embodiments" part in the specification to illustrate the principle of the present application.

DETAILED DESCRIPTION OF PREFERRED EMBODIMENTS

Figure 1:
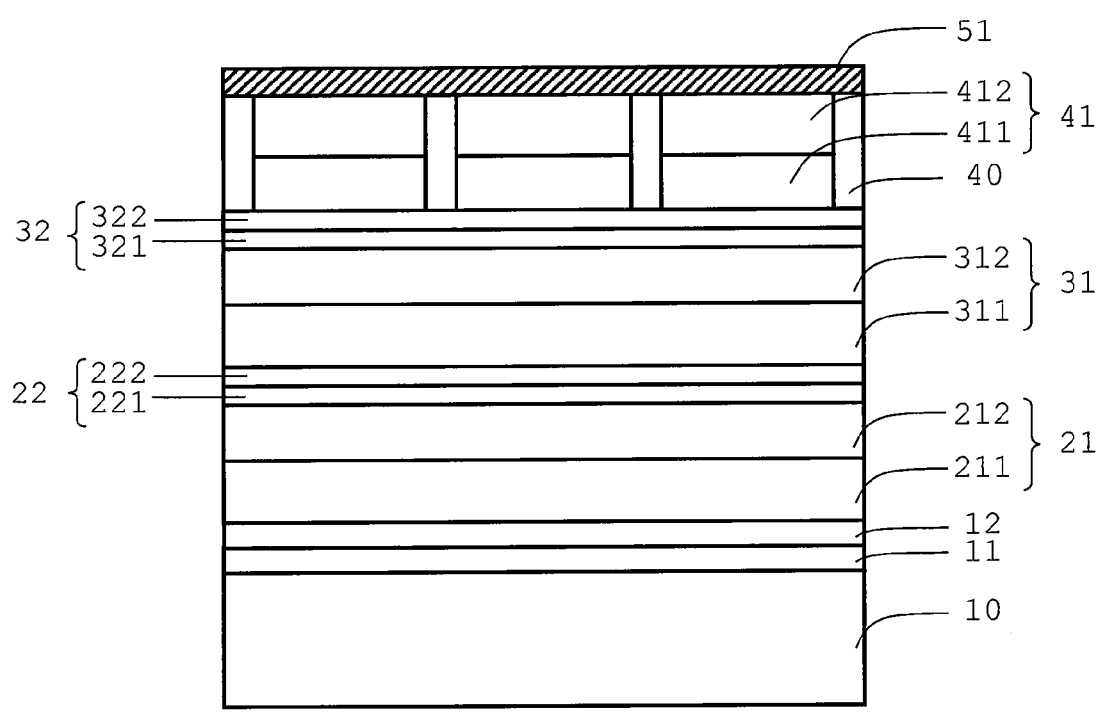
FIGS. 1~3 illustrate a structure and the steps of a manufacture method of a multi-junction solar cell in accordance with the first embodiment of the present application.
Figure 2:
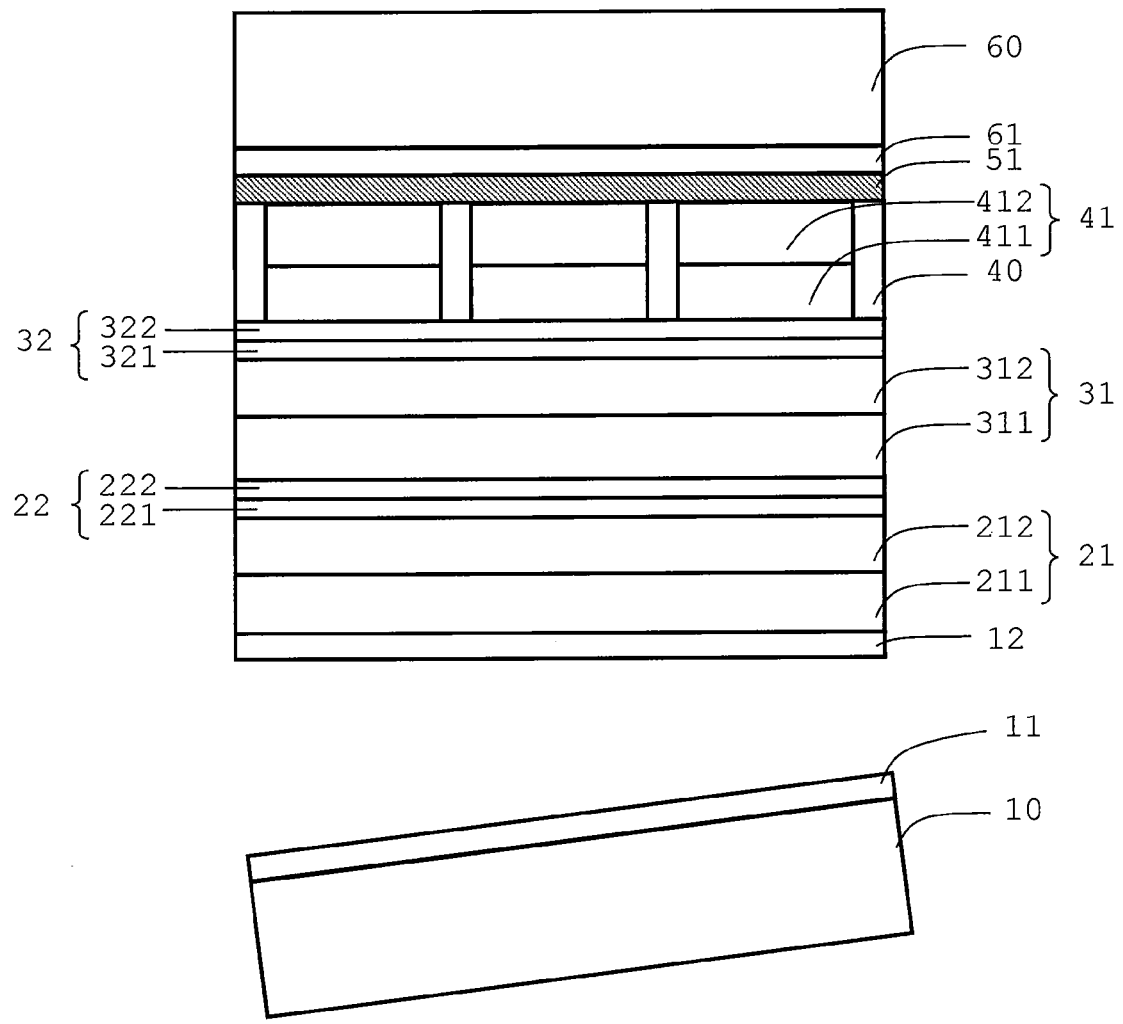
Figure 3:
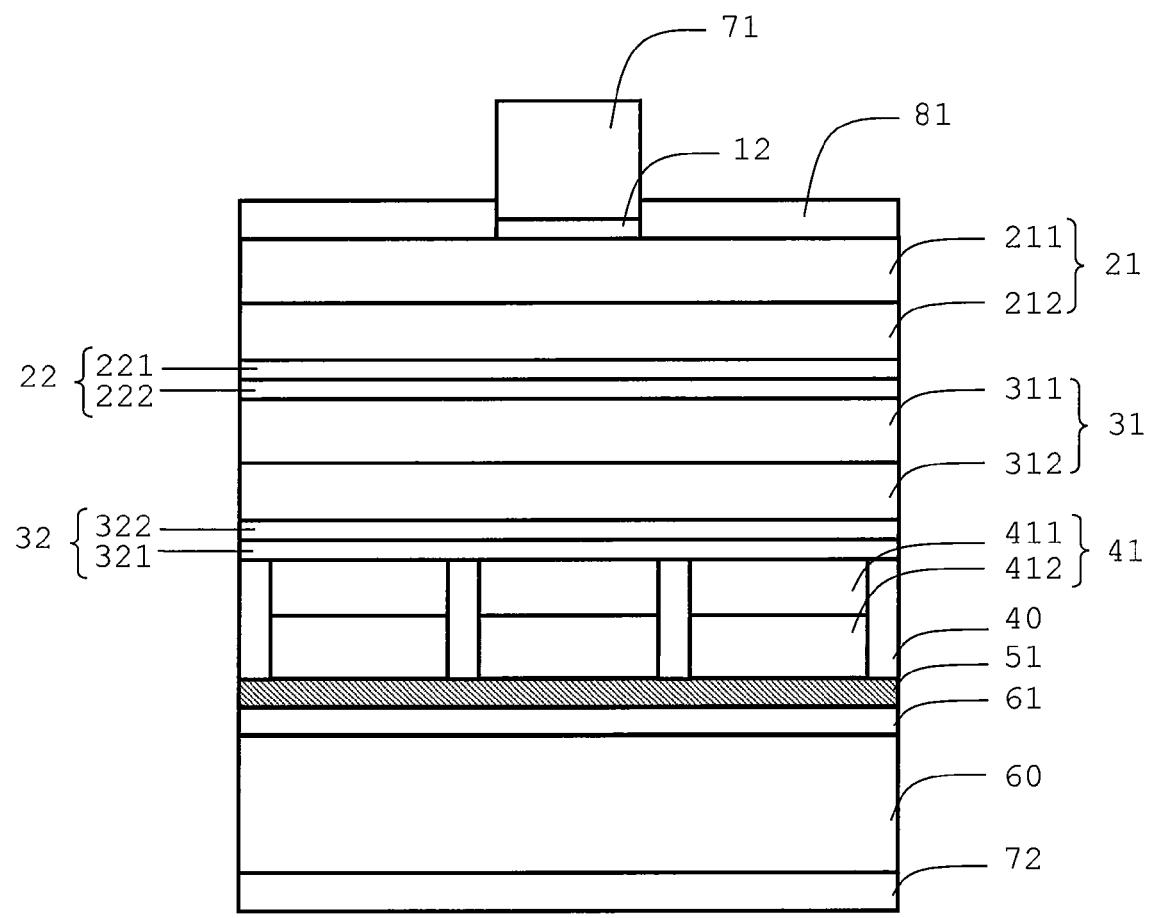

FIGS. 1~3 disclose the structure and the steps of a manufacture method of a multi junction solar cell in accordance with the first embodiment of the present application, and the details are disclosed as follows:

Step 1: As shown in FIG. 1, a growth substrate 10 is provided, and the material of the growth substrate can be Ge, SiGe, or GaAs. A buffer layer 11 is then formed on the growth substrate 10. The composition of the buffer layer 11 is different from but lattice-matched with the growth substrate 10 such as GaAs or InGaP.

Step 2: Forming a contact layer 12 on the buffer layer 11. The material of the contact layer 12 comprises the semiconductor material such as GaAs and has a high impurity concentration, for example, higher than $1*10^{18}$ $cm^{-3}$.

Step 3: Forming a first photovoltaic structure 21 on the contact layer 12 so an ohmic contact is formed between the first photovoltaic structure 21 and the contact layer 12. The first photovoltaic structure 21 with a first band gap comprises a first emitter layer 211 with a first electric conductivity such as n-type and a first base layer 212 with a second electric conductivity which is different from the first electric conductivity, such as p-type. The first emitter layer 211 and the first base layer 212 have the lattice constants matched with the growth substrate 10 and the materials can comprise AlInGaP ($Al_aIn_bGa_{(1-a-b)}P$; $0≦a, b≦1$).

Step 4: Forming a first tunnel junction structure 22 on the first photovoltaic structure 21, wherein the first tunnel junction structure 22 comprises a first tunnel junction layer 221 with a first electric conductivity such as p-type and an impurity concentration higher than $1*10^{18}$ $cm^{-3}$ and a second tunnel junction layer 222 with a second electric conductivity such as n-type and an impurity concentration higher than $1*10^{18}$ $cm^{-3}$. The first tunnel junction layer 221 and the second tunnel junction layer 222 comprise high concentration of impurities and small thicknesses, for example, smaller than 500A, to form a high conductive contact structure.

Step 5: Forming a second photovoltaic structure 31 on the first tunnel junction structure 22. The second photovoltaic structure 31 with a second band gap smaller than the first band gap comprises a second emitter layer 311 with a first electric conductivity such as n-type and a second base layer 312 with a second electric conductivity which is different from the first electric conductivity, such as p-type. The second emitter layer 311 and the second base layer 312 have the lattice constants matched with the growth substrate 10 and the materials can comprise GaAs.

Step 6: Forming a second tunnel junction structure 32 on the second photovoltaic structure 31, wherein the second tunnel junction structure 32 comprises a third tunnel junction layer 321 with a first electric conductivity such as p-type and an impurity concentration higher than $1*10^{18}$ $cm^{-3}$ and a fourth tunnel junction layer 322 with a second electric conductivity different from the first electric conductivity, such as n-type, and an impurity concentration higher than $1*10^{18}$ $cm^{-3}$. The third tunnel junction layer 321 and the fourth tunnel junction layer 322 comprise high concentration of impurities and small thicknesses, for example, smaller than 500A, to form a high conductive contact structure.

Step 7: Forming a patterned structure layer 40 on the second tunnel junction structure 32. The patterned structure layer 40 comprises a pattern to define a plurality of cavities and to expose partial surfaces of the second tunnel junction structure 32 corresponding to the cavities.

Step 8: Forming a third photovoltaic structure 41 in the plurality of the cavities. The third photovoltaic structure is defined as a plurality of discontinuous photovoltaic regions by the patterned structure layer 40. The third photovoltaic structure 41 with a third band gap smaller than the second band gap comprises a third emitter layer 411 with a first electric conductivity such as n-type and a third base layer 412 with a second electric conductivity which is different from the first electric conductivity, such as p-type. The third emitter layer 411 and the third base layer 412 have the lattice constants mismatched with the growth substrate 10. For example, the difference of the lattice constants is larger than 1% and the materials can comprise InGaAs ($In_cGa_{(1-c)}As$; $0≦c≦1$) or InGaAsP ($In_pGa_{(1-p)}As_qP_{(1-q)}$; $0≦p,q≦1$).

Step 9: Forming a photon recycling layer 51 on the third photovoltaic structure 41 and the patterned structure layer 40. The material of the photon recycling layer 51 comprises the material has the reflectivity higher than 70% in a specified light wavelength range and is preferred has the reflectivity higher than 70% in the light wavelength range that the third photovoltaic structure 41 absorbs, such as the metal material or the distributed Bragg reflector (DBR) that conforms to the mentioned condition.

Step 10: As shown in FIG. 2, providing a supporting body 60 and forming a connecting layer 61 on the supporting body 60. The material of the connecting layer 61 can be metal, metal alloy, or conductive polymer material. Then, the photon recycling layer 51 and the supporting body 60 are contacted with the connecting layer 61. The method of contacting can be glue bonding, solder bonding, eutectic bonding and so on.

Step 11: Removing the growth substrate 10 and the buffer layer 11 to expose the contact layer 12. The removing method can be grounding the growth substrate 10 and the buffer layer 11 directly, etching away the buffer layer 11 by the etching solution to peel off the growth substrate 10, or melting and decomposing the buffer layer 11 by laser illumination to peel off the growth substrate 10.

Step 12: As shown in FIG. 3, a part of the contact layer 12 is removed to expose a part of the first photovoltaic structure 21. Forming a first electrode 71 on the contact layer 12 and forming a second electrode 72 to electrically connect to the supporting body 60. The first electrode 71 and the second electrode 72 can be a single-layer or multi-layer metal or metal alloy layers.

Step 13: Forming an anti-reflection layer 81 on the exposed surface of the first photovoltaic structure 21 to complete the first embodiment of the multi junction solar cell 1 in accordance with present application.

As shown in FIG. 3, the multi-junction solar cell 1 comprises a supporting body 60 and a connecting layer 61 located on one surface of the supporting body 60; a second electrode 72 located on another surface of the supporting body 60; a photon recycling layer 51 located on the connecting layer 61; a patterned structure layer 40 located on a part of a surface of the photon recycling layer 51 to define a plurality of the cavities; a third photovoltaic structure 41 with a third band gap located on another part of the surface of the photon recycling layer 51 and in the plurality of the cavities comprising a third base layer 412 and a third emitter layer 411; a second tunnel junction layer 32 located on the third photovoltaic structure 41 and the patterned structure layer 40 comprising a third tunnel junction layer 321 and a fourth tunnel junction layer 322; a second photovoltaic structure 31 with a second band gap located on the second tunnel junction layer 32 comprising a second base layer 312 and a second emitter layer 311; a first tunnel junction layer 22 located on the second photovoltaic structure 31 comprising a first tunnel junction layer 221 and a second tunnel junction layer 222; a first photovoltaic structure 21 with a first band gap located on the first tunnel junction layer 22 comprising a first base layer 212 and a first emitter layer 211; a contact layer 12 located on a part of a surface of the first photovoltaic structure 21 and forming an ohmic contact with the first photovoltaic structure 21; a first electrode 71 located on the contact layer 12; and an anti-reflection layer 81 located on another part surface of the first photovoltaic structure 21.

Figure 4:
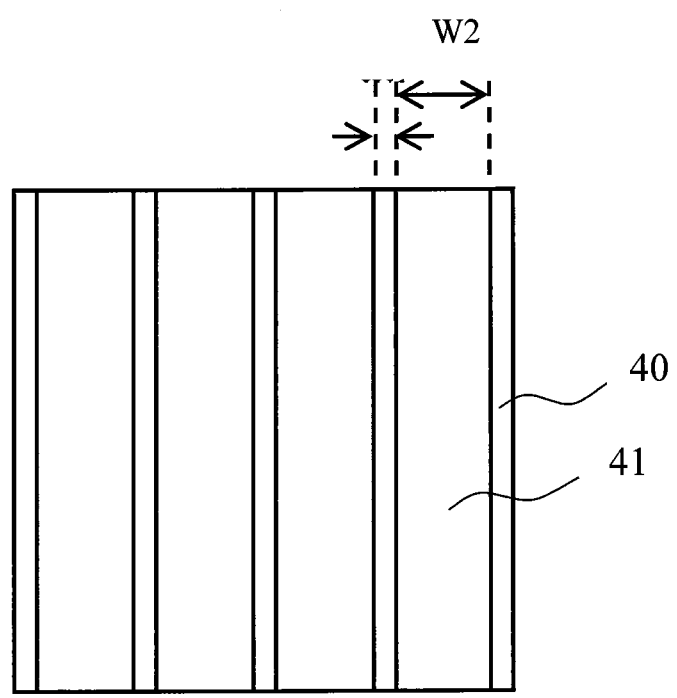
FIG. 4 illustrates a patterned structure layer in accordance with the first embodiment of the present application.
Figure 4:
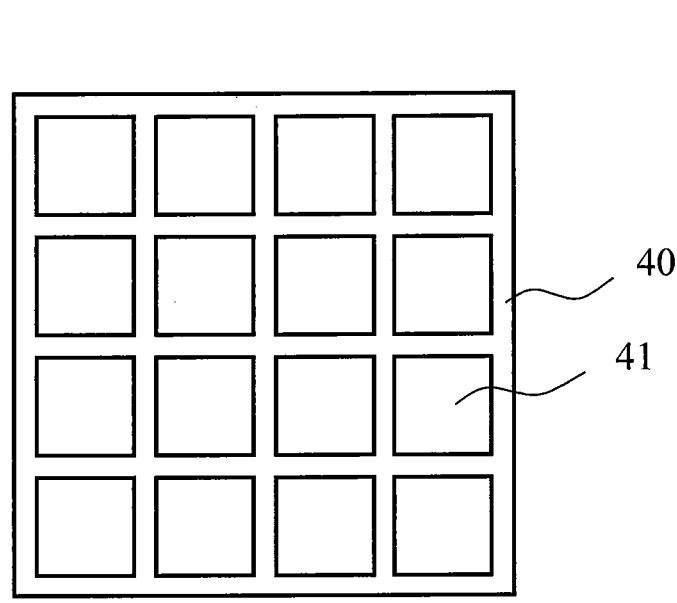

When the sun light enters into the multi-junction solar cell 1 from the anti-reflection layer 81, the light with the shorter wavelength is absorbed by the first photovoltaic structure 21 with a first band gap to convert into a first current, the light with the middle wavelength is absorbed by the second photovoltaic structure 31 with a second band gap smaller than the first band gap to convert into a second current, and the light with the longer wavelength is absorbed by the third photovoltaic structure 41 with a third band gap smaller than the second band gap to convert into a third current. The remaining unabsorbed light can be reabsorbed by the third photovoltaic structure 41 by reflecting the remaining light by the photon recycling layer 51 to compensate the absorbing area loss caused by the patterned structure layer 40 occupying a part of the surface of the third photovoltaic structure 41. The patterns of the patterned structure layer 40 can comprise the parallel stripes 4a or the interlaced stripes 4b as shown in FIG. 4, and the patterns occupy about 1~10% area of the multi junction solar cell 1 to make the third current produced by the third photovoltaic structure 41 close to or larger than one of the first current produced by the first photovoltaic structure 21 or the second current produced by the second photovoltaic structure 31. The widths of the parallel stripes or the interlaced stripes are about 0.5 μm~5 μm and the heights of the parallel stripes or the interlaced stripes are about 0.5 μm~5 μm as defined by the thickness of the third photovoltaic structure 41. The ratios of the heights and the widths of the parallel stripes or the interlaced stripes are about 0.1~10, and is preferred to be about 0.5~5. The preferred material of the patterned structure layer 40 is good insulating amorphous material such as oxide material or nitride material. Besides, because the third photovoltaic structure 41 is lattice mismatched with the growth substrate 10, the thread dislocation is formed and extending easily in epitaxial growth, and the quality of the epitaxial layers and the conversion efficiency of the multi-junction solar cell are impacted accordingly. The lattice mismatch also causes the accumulation of the stress, which makes the wafer over bending and crack. The patterned structure layer 40 can stop the thread dislocation extending efficiently so the stress caused by the lattice mismatch can be released by forming the third photovoltaic structure 41 in the plurality of the cavities formed by the patterned structure layer 40. The wafer bending and crack can also be eliminated.

Figure 5:
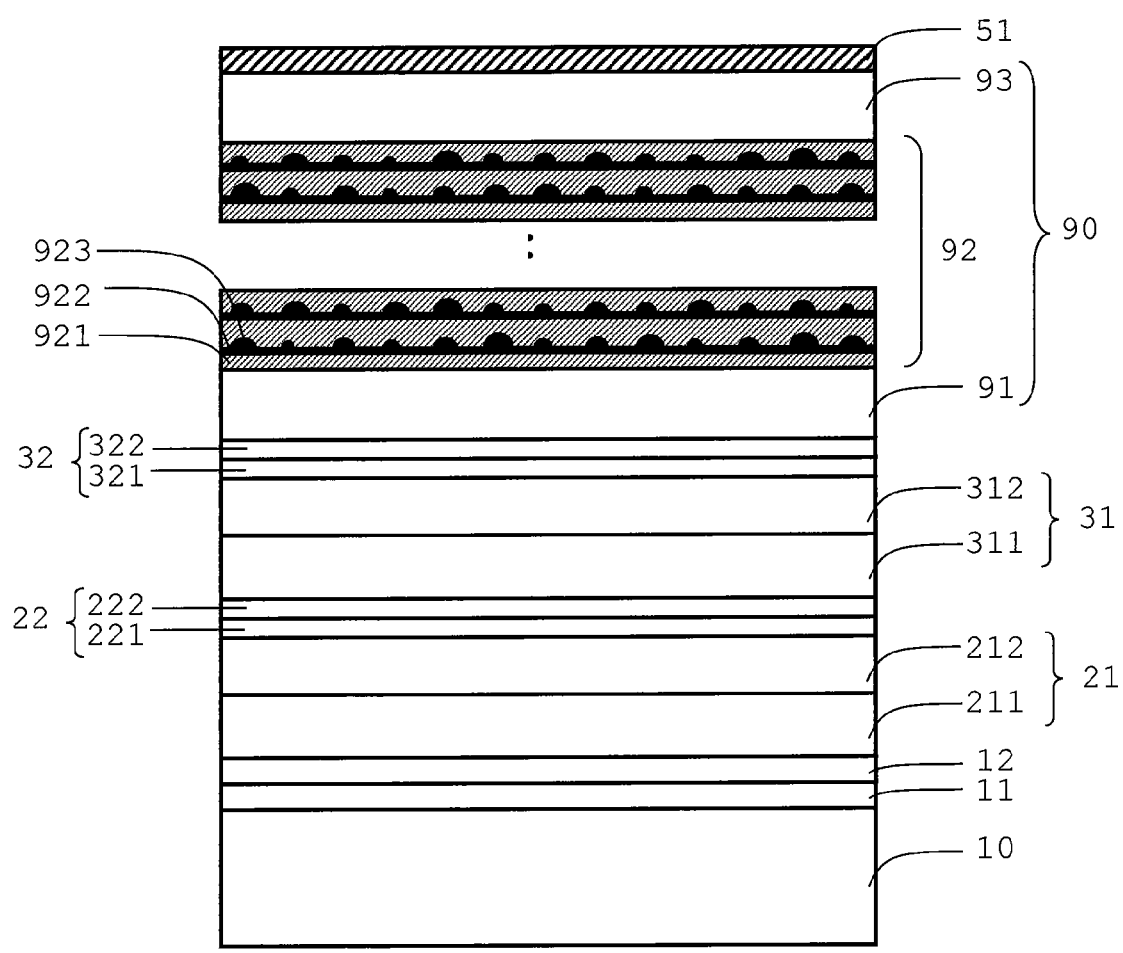
FIGS. 5~7 illustrate a structure and the steps of a manufacture method of a multi-junction solar cell in accordance with the second embodiment of the present application.
Figure 6:
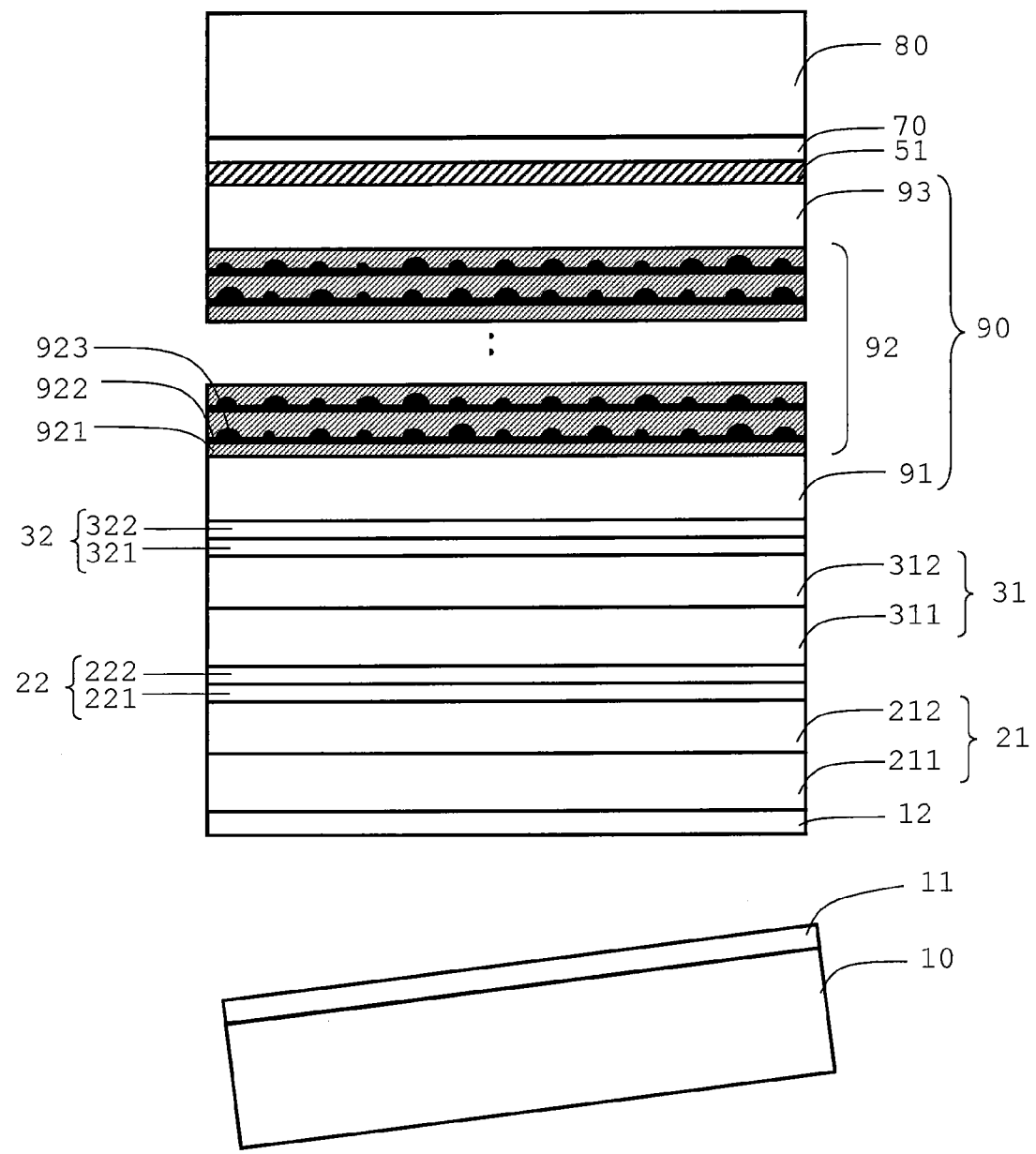

FIGS. 5~6 disclose the second embodiment of the multi junction solar cell in accordance with the present application. The details of the structure and the steps of the manufacture method are disclosed as the following:

Step 1: As shown in FIG. 5, a growth substrate 10 is provided, and the material of the growth substrate can be Ge, SiGe, or GaAs. A buffer layer 11 is then formed on the growth substrate 10. The composition of the buffer layer 11 is different from but lattice-matched with the growth substrate 10 such as GaAs or InGaP.

Step 2: Forming a contact layer 12 on the buffer layer 11. The material of the contact layer 12 comprises the semiconductor material such as GaAs and has a high impurity concentration, for example, higher than $1*10^{18}$ cm$^{-3}$.

Step 3: Forming a first photovoltaic structure 21 on the contact layer 12 so an ohmic contact is formed between the first photovoltaic structure 21 and the contact layer 12. The first photovoltaic structure 21 with a first band gap comprises a first emitter layer 211 with a first electric conductivity such as n-type and a first base layer 212 with a second electric conductivity which is different from the first electric conductivity, such as p-type. The first emitter layer 211 and the first base layer 212 have the lattice constants matched with the growth substrate 10 and the materials can comprise AlInGaP (Al$_a$In$_b$Ga$_{(1-a-b)}$P 0☐a, b☐1).

Step 4: Forming a first tunnel junction structure 22 on the first photovoltaic structure 21, wherein the first tunnel junction structure 22 comprises a first tunnel junction layer 221 with a first electric conductivity such as p-type and an impurity concentration higher than $1*10^{18}$ cm$^{-3}$ and a second tunnel junction layer 222 with a second electric conductivity such as n-type and an impurity concentration higher than $1*10^{18}$ cm$^{-3}$. The first tunnel junction layer 221 and the second tunnel junction layer 222 comprise high concentration of impurities and small thicknesses, for example, smaller than 500A, to form a high conductive contact structure.

Step 5: Forming a second photovoltaic structure 31 on the first tunnel junction structure 22. The second photovoltaic structure 31 with a second band gap smaller than the first band gap comprises a second emitter layer 311 with a first electric conductivity such as n-type and a second base layer 312 with a second electric conductivity which is different from the first electric conductivity, such as p-type. The second emitter layer 311 and the second base layer 312 have the lattice constants matched with the growth substrate 10 and the materials can comprise GaAs.

Step 6: Forming a second tunnel junction structure 32, wherein the second tunnel junction structure 32 comprises a third tunnel junction layer 321 with a first electric conductivity such as p-type and an impurity concentration higher than $1*10^{18}$ cm$^{-3}$ and a fourth tunnel junction layer 322 with a second electric conductivity different from the first electric conductivity such as n-type and an impurity concentration higher than $1*10^{18}$ cm$^{-3}$. The third tunnel junction layer 321 and the fourth tunnel junction layer 322 comprise high concentration of impurities and small thicknesses, for example, smaller than 500A to form a high conductive contact structure.

Figure 8:
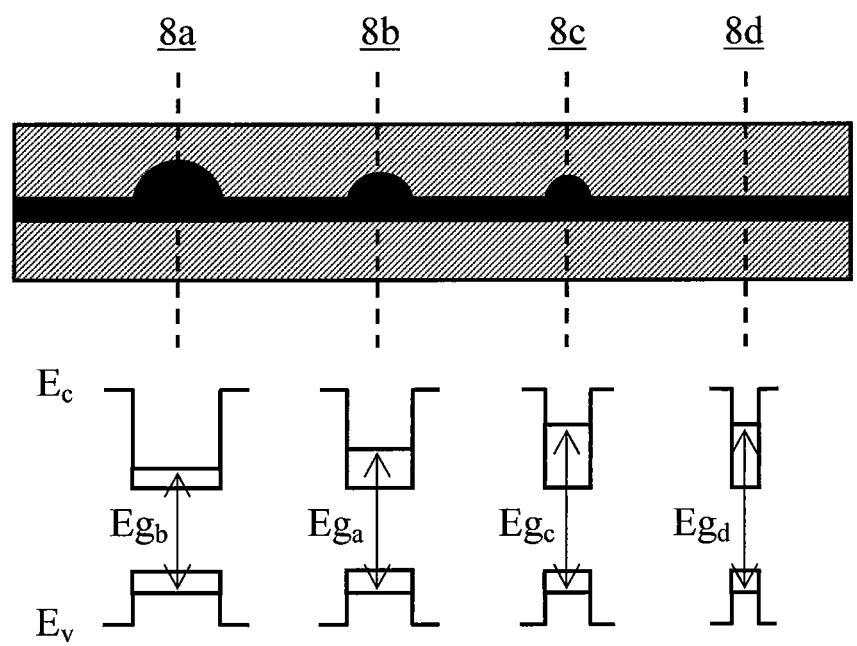
FIG. 8 illustrates the band gap diagram of the quantum dot layer in accordance with the second embodiment of the present application.

Step 7: Forming a third photovoltaic structure 90 on the second tunnel junction structure 32. The third photovoltaic structure 90 with a third band gap smaller than the second band gap comprises a third emitter layer 91 with a first electric conductivity such as n-type, a third base layer 93 with a second electric conductivity which is different from the first electric conductivity, such as p-type, and a quantum dot area 92 located between the third emitter layer 91 and the third base layer 93. The third emitter layer 91 and the third base layer 93 have the lattice constants matched with the growth substrate 10 and the materials can comprise InGaAs (In$_c$Ga$_{(1-c)}$As; 0☐c☐1) or InGaAsP (In$_p$Ga$_{(1-p)}$As$_q$P$_{(1-q)}$; 0☐p,q☐1). The quantum dot area 92 comprises a plurality of cap layers 921, a plurality of quantum well layers 922, and a plurality of quantum dot layers 923 stacked alternately. The cap layer 921 can also be a barrier layer to gather the carriers (electrons or holes) in the quantum well layers 922 or in the quantum dot layers 923, and be a flat layer to flatten the surface roughened by the quantum dot layers 923 and to maintain the flatness of the surface of the device. The material of the cap layer 921 can be the same material of the third emitter layer 91, or the extrinsic or intrinsic semiconductor material with the same electrical conductivity as the third emitter layer 91. The quantum well layer 922 is formed on the cap layer 921 with a band gap smaller than the band gap of the cap layer 921 and lattice mismatched with the growth substrate 10. For example, the difference of the lattice constants is larger than 1% and the materials can comprise InGaAs (In$_d$Ga$_{(1-d)}$As; 0☐d☐1) or InGaAsP (In$_r$Ga$_{(1-r)}$As$_s$P$_{(1-s)}$; 0☐r,s☐1). The thickness of the quantum well layer 922 is between 1~10 nm and is preferred between 1~5 nm to stop the formation and extension of the lattice defect. The quantum dot layer 923 is formed on the quantum well layer 922 by the combination of a plurality of irregularly arranged quantum dots, and is composed of substantially the same material with the quantum well layer 922. The quantum dot layers 923 form a plurality of band gaps different from the band gaps of the quantum well layers 922. As shown in FIG. 8, the plurality of the quantum dots with different sizes 8a, 8b, 8c has the corresponding band gap Eg$_a$, Eg$_b$, $Eg_c$ larger than the band gap $Eg_d$ of the quantum well layer 922 to expand the absorbable wavelength range and to raise the conversion efficiency of the third photovoltaic structure 90. The quantum dot layer 923 is the discontinuous photoelectric converting structure formed by the plurality of distinct quantum dots with the diameters of substantially about 1~10 nm, which can not only raise the conversion efficiency but help to release the stress caused by the lattice mismatch.

Step 8: Forming a photon recycling layer 51 on the third photovoltaic structure 41. The material of the photon recycling layer 51 comprises the material having the reflectivity higher than 70% in a specified light wavelength range and is preferred has the reflectivity higher than 70% in the light wavelength range that the third photovoltaic structure 41 absorbs, such as the metal material or the distributed Bragg reflector (DBR) that meets the mentioned condition.

Step 9: As shown in FIG. 6, providing a supporting body 60 and forming a connecting layer 61 on the supporting body 60. The material of the connecting layer 61 can be metal, metal alloy, or conductive polymer material. Then the photon recycling layer 51 and the supporting body 60 are contacted with the connecting layer 61. The method for contacting can be glue bonding, solder bonding, eutectic bonding and so on.

Step 10: Removing the growth substrate 10 and the buffer layer 11 to expose the contact layer 12. The removing method can be grounding the growth substrate 10 and the buffer layer 11 directly, etching away the buffer layer 11 by the etching solution to peel off the growth substrate 10, or melting and decomposing the buffer layer 11 by laser illumination to peel off the growth substrate 10.

Figure 7:
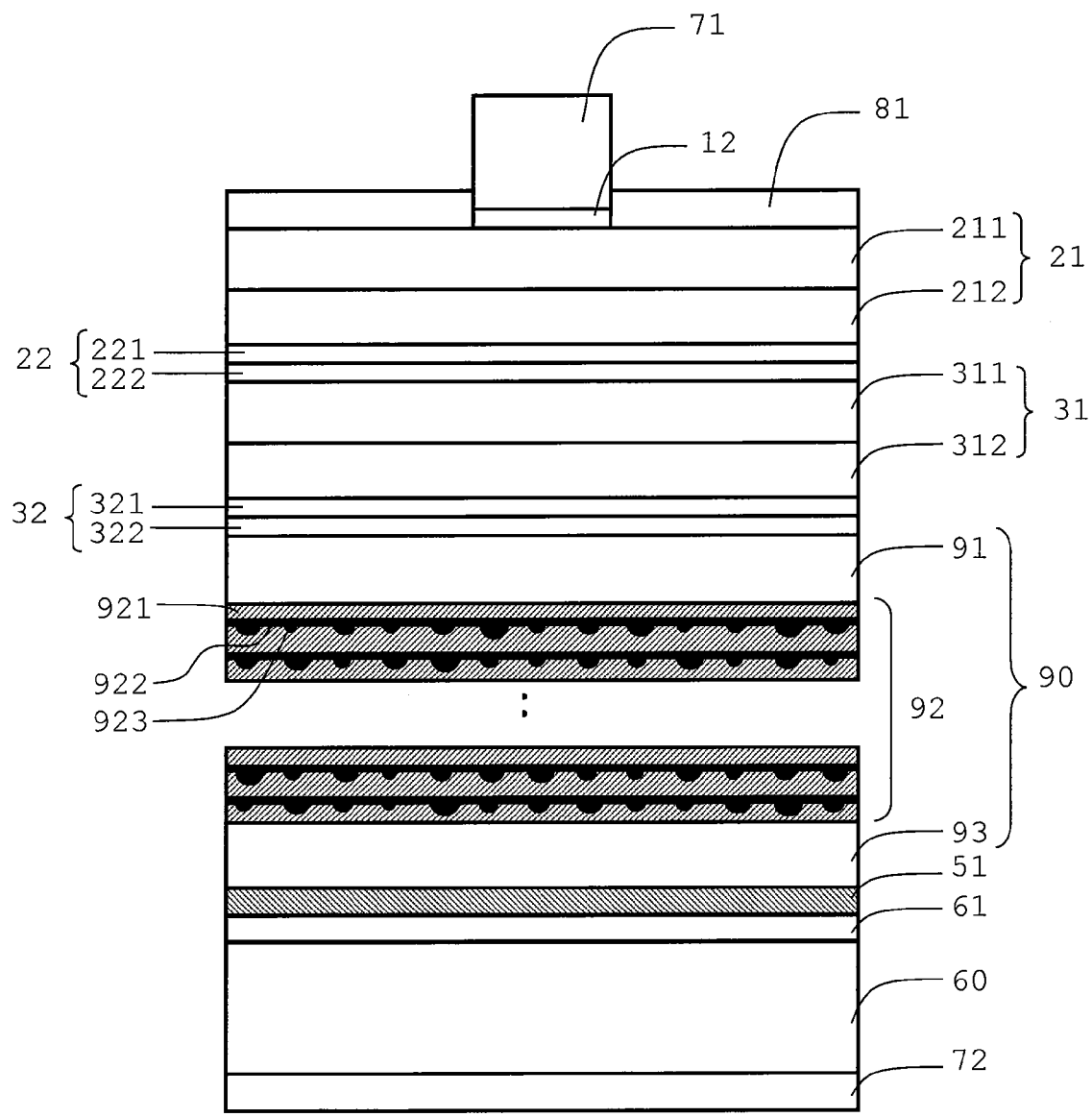

Step 11: As shown in FIG. 7, a part of the contact layer 12 is removed to expose a part of the first photovoltaic structure 21. Forming a first electrode 71 on the contact layer 12 and forming a second electrode 72 to electrically connect to the supporting body 60. The first electrode 71 and the second electrode 72 can be a single-layer, multi-layer metal or metal alloy layers.

Step 12: Forming an anti-reflection layer 81 on the exposed surface of the first photovoltaic structure 21 to complete the multi-junction solar cell 2 of the first embodiment in accordance with present application.

As shown in FIG. 7, the multi junction solar cell 2 comprises a supporting body 60 and a connecting layer 61 located on one surface of the supporting body 60; a second electrode 72 located on another surface of the supporting body 60; a photon recycling layer 51 located on the connecting layer 61; a third photovoltaic structure 90 with a third band gap located on the photon recycling layer 51 comprising a third base layer 93, a quantum dot area 92 and a third emitter layer 91; a second tunnel junction layer 32 located on the third photovoltaic structure 90 comprising a third tunnel junction layer 321 and a fourth tunnel junction layer 322; a second photovoltaic structure 31 with a second band gap located on the second tunnel junction layer 32 comprising a second base layer 312 and a second emitter layer 311; a first tunnel junction layer 22 located on the second photovoltaic structure 31 comprising a first tunnel junction layer 221 and a second tunnel junction layer 222; a first photovoltaic structure 21 with a first band gap located on the first tunnel junction layer 22 comprising a first base layer 212 and a first emitter layer 211; a contact layer 12 located on a part of a surface of the first photovoltaic structure 21 and forming an ohmic contact with the first photovoltaic structure 21; a first electrode 71 located on the contact layer 12; and an anti-reflection layer 81 located on another part surface of the first photovoltaic structure 21.

When the sun light enters the multi-junction solar cell 2 from the anti-reflection layer 81, the light with the shorter wavelength is absorbed by the first photovoltaic structure 21 with a first band gap to convert into a first current, the light with the middle wavelength is absorbed by the second photovoltaic structure 31 with a second band gap smaller than the first band gap to convert into a second current, and the light with the longer wavelength is absorbed by the third photovoltaic structure 90 which comprising a discontinuous optic-electronic conversion structure formed by a quantum dot layer, with a third band gap smaller than the second band gap, to convert into a third current. The remaining unabsorbed light can be reabsorbed by the third photovoltaic structure 90 by reflecting the remaining light by the photon recycling layer 51 to compensate the absorbing area loss caused by some areas where the quantum dots are not formed in the third photovoltaic structure 90. Besides, because the third photovoltaic structure 90 is lattice mismatched with the growth substrate 10, the thread dislocation is formed and extending easily in epitaxial growth and the quality of the epitaxial layers and the conversion efficiency of the multi-junction solar cell are impacted accordingly. The lattice mismatch also causes the accumulation of the stress, which makes the wafer bending and crack. The quantum dot area 92 in accordance with the present application comprising the quantum dot layer 923 having the discontinuous photoelectric converting structure formed by the plurality of distinct quantum dots can stop the thread dislocation extending efficiently, the stress caused by the lattice mismatch could be released, and the conversion efficiency can also be enhanced by different quantum band gaps formed by the different sizes of the plurality of the quantum dots. The stack number of the quantum dot layers is about 5~100 layers, and is preferred to have about 10~70 layers to make the third current generated by the third photovoltaic structure 90 close to or larger than the first current generated by the first photovoltaic structure 21 or the second current generated by the second photovoltaic structure 31.

Figure 9:
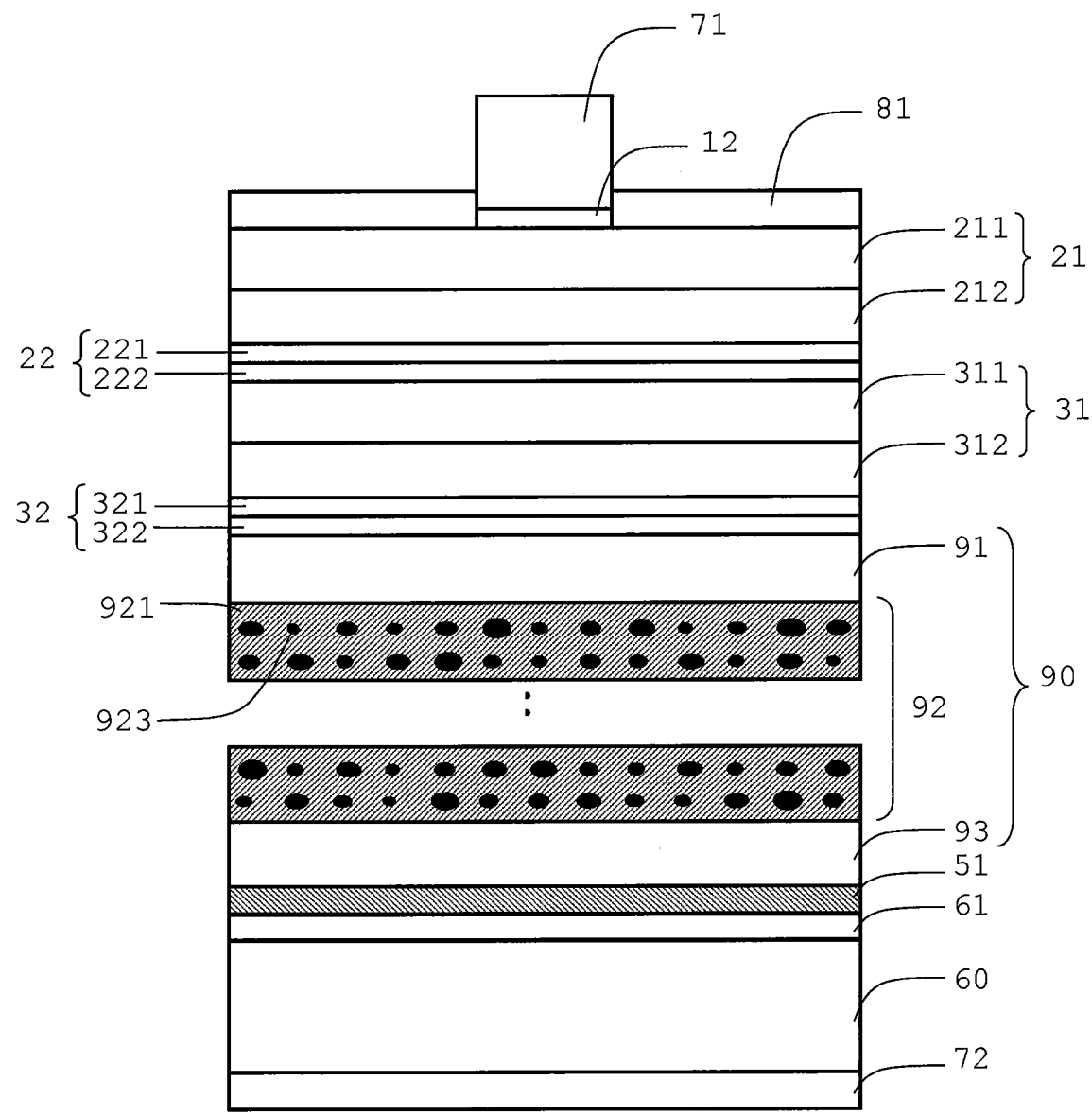
FIG. 9 illustrates a structure of a multi junction solar cell in accordance with the third embodiment of the present application.

FIG. 9 discloses a multi junction solar cell of the third embodiment in accordance with the present application. Comparing with the multi junction solar cell 2 shown in FIG. 7, the quantum dot area 92 comprises only a plurality of cap layers 921 and a plurality of quantum dot layers 923 stacked alternately without the quantum well layers 922 disclosed in FIG. 7. Therefore, in the multi-junction solar cell 3, the quantum dot layers 923 which cause the lattice mismatch are formed discontinuously in three dimensional, and the quantum well layers 922 covering the overall surface as shown in FIG. 7 do not exist. Therefore, the stress caused by the lattice defect and the lattice mismatch can be further reduced and the optic-electric conversion efficiency is raised.

A multi-junction solar cell comprises a discontinuous photoelectric converting structure is disclosed in the present application. In the present application, the discontinuous photoelectric converting structure can be formed in at least one of the first photovoltaic structure, the second photovoltaic structure, and the third photovoltaic structure. The discontinuous photoelectric converting structure in the present application comprises but not limited to the discontinuous photovoltaic regions in the plurality of cavities defined by the patterned structure layer in accordance with one embodiment of the present application or the plurality of the quantum dots that are comprised in the quantum dot layers in accordance with another embodiment of the present application.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A multi-junction solar cell, comprising:
a support layer having a width;
an intermediate layer arranged on the support layer and having a continuous surface having a width equal to the width of the support layer;
a patterned structure layer having a plurality of patterned structures, each patterned structure having a lower surface directly connected to the intermediate layer and a top surface opposite to the lower surface, wherein the plurality of patterned structures are separated by a plurality of openings;
wherein the intermediate layer is between the support layer and the patterned structure layer;
a plurality of photovoltaic base layers, wherein each of the openings contains a single photovoltaic base layer of the plurality of photovoltaic base layers and each photovoltaic base layer is directly connected to the intermediate layer, wherein each opening has a width equal to a width of the corresponding photovoltaic base layer;
a tunneling junction layer arranged above the plurality of photovoltaic base layers and above the patterned structure layer, and directly connected to the patterned structure layer;
a first semiconductor stack having a width equal to the width of the support layer, wherein the first semiconductor stack is arranged above and in direct contact with the tunneling junction layer; and
a second semiconductor stack arranged above the first semiconductor stack and having a width equal to the width of the first semiconductor stack, wherein the tunneling junction layer directly connects to the top surface of the patterned structure layer, and wherein each of the plurality of photovoltaic base layers are directly sandwiched between two of the patterned structures.

2. The multi-junction solar cell of claim 1, wherein the intermediate layer comprises a photon recycling layer.

3. The multi-junction solar cell of claim 1, wherein each of the openings has equal width.

4. The multi-junction solar cell of claim 1, wherein the plurality of patterned structures all have a same height.

5. The multi-junction solar cell of claim 4, wherein the plurality of patterned structures are arranged in the form of parallel stripes or interlaced stripes.

6. The multi-junction solar cell of claim 5, further comprising a plurality of emitter layers, wherein each emitter layer is arranged between one of the plurality of photovoltaic base layers and the tunneling junction layer, and each of the plurality of emitter layers are directly connected to the tunneling junction layer.

7. The multi-junction solar cell of claim 1, wherein the continuous surface of the intermediate layer extends along the lower surface of each of the patterned structures of the patterned structure layer.

* * * * *